United States Patent
Zagrebelny et al.

(10) Patent No.: US 8,653,494 B2
(45) Date of Patent: Feb. 18, 2014

(54) INTEGRATED CIRCUITRY, METHODS OF FORMING MEMORY CELLS, AND METHODS OF PATTERNING PLATINUM-CONTAINING MATERIAL

(71) Applicant: Micron Technology, Inc., Boise, ID (US)

(72) Inventors: Andrey V. Zagrebelny, Eagan, MN (US); Chet E. Carter, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 13/781,523

(22) Filed: Feb. 28, 2013

(65) Prior Publication Data

US 2013/0175495 A1    Jul. 11, 2013

Related U.S. Application Data

(62) Division of application No. 13/083,354, filed on Apr. 8, 2011, now Pat. No. 8,409,960.

(51) Int. Cl.
    *H01L 21/02*    (2006.01)
(52) U.S. Cl.
    USPC .................................................. 257/2
(58) Field of Classification Search
    USPC ............................. 257/758, 2, 4, 3
    See application file for complete search history.

(56) References Cited

U.S. PATENT DOCUMENTS

| | | |
|---|---|---|
| 5,969,422 A | 10/1999 | Ting et al. |
| 6,265,068 B1 | 7/2001 | David et al. |
| 6,734,489 B2 | 5/2004 | Morimoto et al. |
| 6,888,215 B2 | 5/2005 | Radens et al. |
| 7,147,890 B2 | 12/2006 | Igarashi et al. |
| 7,262,504 B2 | 8/2007 | Cheng et al. |
| 7,402,488 B2 | 7/2008 | Cho et al. |
| 7,678,293 B2 | 3/2010 | Braune et al. |
| 7,727,897 B2 | 6/2010 | Ulrich et al. |
| 7,820,074 B2 | 10/2010 | Kim et al. |
| 2004/0251551 A1 | 12/2004 | Hideki |
| 2005/0280156 A1 | 12/2005 | Lee |
| 2006/0157857 A1 | 7/2006 | Lane et al. |
| 2007/0279974 A1* | 12/2007 | Dennison et al. ............. 365/163 |
| 2008/0020508 A1* | 1/2008 | Dennison ..................... 438/102 |
| 2009/0224405 A1 | 9/2009 | Chiou et al. |
| 2010/0062577 A1 | 3/2010 | Liao et al. |
| 2010/0065915 A1 | 3/2010 | Chuang et al. |
| 2010/0252798 A1 | 10/2010 | Sumino |
| 2011/0076825 A1 | 3/2011 | Lung |
| 2012/0187363 A1* | 7/2012 | Liu et al. ........................... 257/5 |
| 2012/0248504 A1* | 10/2012 | Liu ............................... 257/208 |

* cited by examiner

*Primary Examiner* — Nathan Ha
(74) *Attorney, Agent, or Firm* — Wells St. John P.S.

(57) ABSTRACT

Some embodiments include methods of patterning platinum-containing material. An opening may be formed to extend into an oxide. Platinum-containing material may be formed over and directly against an upper surface of the oxide, and within the opening. The platinum-containing material within the opening may be a plug having a lateral periphery. The lateral periphery of the plug may be directly against the oxide. The platinum-containing material may be subjected to polishing to remove the platinum-containing material from over the upper surface of the oxide. The polishing may delaminate the platinum-containing material from the oxide, and may remove the platinum-containing material from over the oxide with an effective selectivity for the platinum-containing material relative to the oxide of at least about 5:1. Some embodiments include methods of forming memory cells. Some embodiments include integrated circuitry having platinum-containing material within an opening in an oxide and directly against the oxide.

9 Claims, 7 Drawing Sheets

INTEGRATED CIRCUITRY, METHODS OF FORMING MEMORY CELLS, AND METHODS OF PATTERNING PLATINUM-CONTAINING MATERIAL

RELATED PATENT DATA

This patent resulted from a divisional of U.S. patent application Ser. No. 13/083,354, which was filed Apr. 8, 2011, which issued as U.S. Pat. No. 8,409,960, and which is hereby incorporated herein by reference.

TECHNICAL FIELD

Integrated circuitry, methods of forming memory cells, and methods of patterning platinum-containing material.

BACKGROUND

Memory is one type of integrated circuitry, and is used in computer systems for storing data. Integrated memory is usually fabricated in one or more arrays of individual memory cells. The memory cells are configured to retain or store memory in at least two different selectable states. In a binary system, the states are considered as either a "0" or a "1". In other systems, at least some individual memory cells may be configured to store more than two levels or states of information.

Integrated circuitry fabrication continues to strive to produce smaller and denser integrated circuits. The smallest and simplest memory cell will likely be comprised of two electrically conductive electrodes having a programmable material received between them. Suitable programmable materials have two or more selectable resistive states to enable storing of information by an individual memory cell. The reading of the cell comprises determination of which of the states the programmable material is in, and the writing of information to the cell comprises placing the programmable material in a predetermined resistive state.

Significant interest is presently being directed toward programmable materials that contain mobile ions as charge carriers (such programmable materials may be referred to as ion-mobility-based programmable materials). The ion-mobility-based programmable materials may be converted from one memory state to another by moving the mobile charge carriers therein to alter a distribution of charge density within the programmable materials. Some example memory devices that utilize ions as mobile charge carriers are resistive RAM (RRAM) cells; which can include classes of memory cells containing multivalent oxides, and which can include memristors in some specific applications. Other example memory devices that utilize mobile ions as charge carriers are programmable metallization cells (PMCs); which may be alternatively referred to as a conductive bridging RAM (CBRAM), nanobridge memory, or electrolyte memory.

The RRAM cells may contain ion-mobility-based programmable material sandwiched between a pair of electrodes. The programming of the RRAM cells may comprise transitioning the programmable material between a first memory state in which charge density is relatively uniformly dispersed throughout the material and a second memory state in which the charge density is concentrated in a specific region of the material (for instance, a region closer to one electrode than the other). A PMC cell may similarly have ion-mobility-based programmable material sandwiched between a pair of current conductive electrodes. However, programming of the PMC comprises transitioning the PMC between a first state in which there is no conductive bridge between the electrodes and a second state in which mobile ions arrange to form super-ionic clusters or conducting filaments that electrically couple the electrodes to one another.

In some applications, there can be advantages to having one or both of the electrodes of a memory cell comprise platinum. For instance, some ion-mobility-based programmable materials comprise a combination of Pr, Ca, Mn and O (so-called PCMO, which may be, for example, $Pr_{0.7}Ca_{0.3}MnO_3$), and it can be advantageous to have such programmable materials be directly against a platinum electrode.

Difficulties are encountered in forming platinum electrodes, in that platinum is a noble metal and can be difficult to pattern. It would be desirable to develop new methods for incorporating platinum electrodes into memory cells, and new memory cell architectures which include ion-mobility-based programmable materials in combination with at least one electrode.

Platinum may have other applications in integrated circuitry in addition to, or alternatively to, the utilization of platinum as an electrode of a memory cell. For instance, platinum may be utilized as electrically conductive contacts or interconnects in integrated circuitry. It would desirable to develop methods of patterning platinum that could be suitable to fabricate platinum into electrically conductive contacts or interconnects.

DETAILED DESCRIPTION OF THE ILLUSTRATED EMBODIMENTS

In some embodiments, platinum-containing material is fabricated into electrodes or contacts. The fabrication may include formation of the platinum-containing material over an oxide, and within an opening that extends into the oxide. Subsequently, the platinum-containing material may be removed from over the oxide with polishing, while leaving the platinum-containing material within the opening. Some embodiments advantageously utilize polishing methods which delaminate the platinum-containing material from over the oxide to cleanly remove such platinum-containing material.

An example embodiment is described with reference to FIGS. 1-7.

Figure 1:
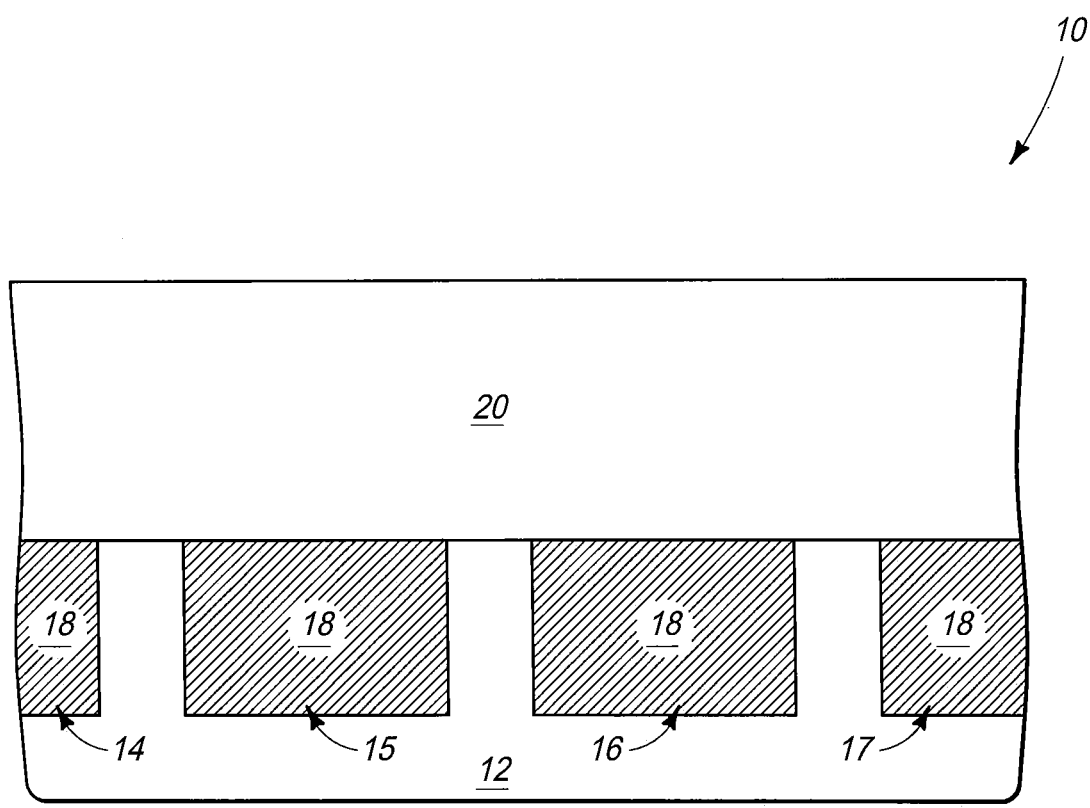
FIG. 1 is a diagrammatic cross-sectional view of a portion of a semiconductor construction at a processing stage of an example embodiment method of forming memory cells.

Referring to FIG. 1, a construction 10 comprises an electrically insulative material 12 supporting a plurality of electrically conductive structures 14-17.

The electrically insulative material 12 may comprise any suitable composition or combination of compositions, and in some embodiments may comprise one or more of silicon nitride, silicon dioxide, and any of various doped glasses (for instance, borophosphosilicate glass, phosphosilicate glass, fluorosilicate glass, etc.). The insulative material 12 may be supported over a semiconductor base (not shown). Such base may comprise, for example, monocrystalline silicon. If the electrically insulative material is supported by a semiconductor base, the combination of the electrically insulative material 12 and the underlying semiconductor base may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some embodiments, the insulative material 12 may be over a semiconductor construction which comprises a semiconductor base and one or more levels of integrated circuitry. In such embodiments, the levels of integrated circuitry may comprise, for example, one or more of refractory metal materials, barrier materials, diffusion materials, insulator materials, etc.

The electrically conductive structures 14-17 may be lines extending in and out of the page relative to the cross-sectional view of FIG. 1. Such lines may correspond to access/sense lines; and may, for example, correspond to wordlines or bitlines in some embodiments.

The electrically conductive structures 14-17 comprise electrically conductive material 18. Such electrically conductive material may comprise any suitable composition or combination of compositions; and in some embodiments may comprise, consist essentially of, or consist of one or more of various metals (for instance, tungsten, titanium, copper, etc.), metal-containing substances (for instance, metal nitride, metal silicide, metal carbide, etc.) and conductively-doped semiconductor materials (for instance, conductively-doped silicon, conductively-doped germanium, etc.).

An oxide 20 extends over the conductive structures 14-17. The oxide 20 may comprise any suitable material, and in some embodiments may comprise, consist essentially of, or consist of silicon dioxide. The silicon dioxide may be formed utilizing any suitable processing; including, for example, one or both of atomic layer deposition (ALD) and chemical vapor deposition (CVD). In some embodiments, the silicon dioxide may be formed by deposition utilizing tetraethylorthosilicate (TEOS) as a precursor material. In some embodiments, the oxide 20 may comprise a low dielectric constant oxide (with the term "low dielectric constant" meaning a dielectric constant less than the dielectric constant of silicon oxide, and specifically less than 3.9). Example low dielectric constant oxides include porous silicon dioxide, porous carbon-doped silicon dioxide, and various spin-on organic polymeric dielectrics.

Figure 2:
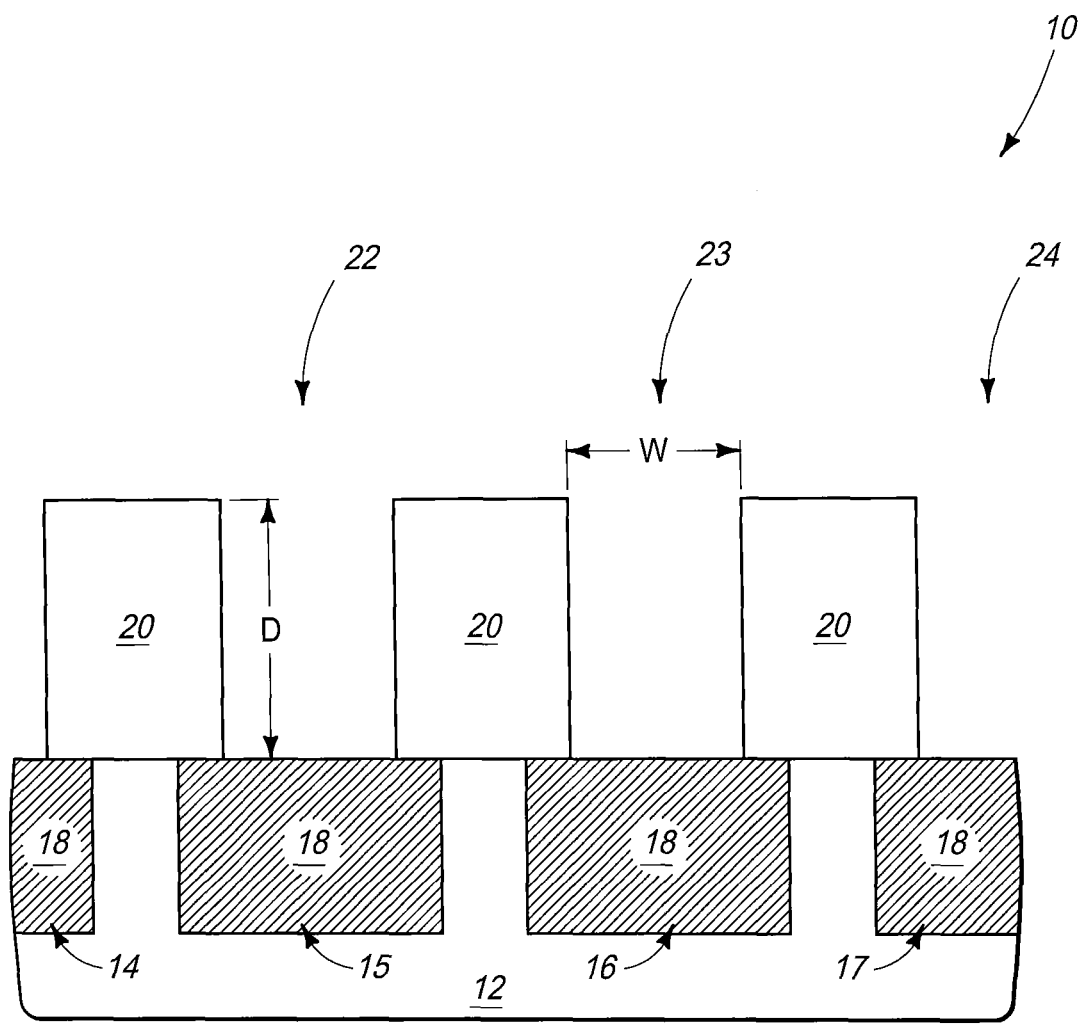
FIG. 2 is a view of the cross-section of FIG. 1 shown at a processing stage subsequent to that of FIG. 1.

Referring to FIG. 2, openings 22-24 are etched through oxide 20 and to upper surfaces of the conductive structures 15-17, respectively. Another opening (not shown) may be etched through the oxide to an upper surface of conductive structure 14.

The openings 22-24 may be formed with any suitable processing. For instance, a mask (not shown) may be formed over the top of oxide 20 to define locations of openings 22-24, one or more etches may be utilized to transfer a pattern from the mask through oxide 20 to form the openings, and then the mask may be removed to leave the construction shown in FIG. 2. The patterned mask may comprise any suitable composition or combination of compositions, and may, for example, comprise photoresist and/or materials fabricated utilizing pitch-multiplication methodologies.

In the shown embodiment, the openings 22-24 extend entirely through the oxide 20. In other embodiments (not shown), openings may be formed to extend into an oxide, but not entirely through the oxide.

The openings 22-24 may have any suitable dimensions. In some embodiments, the openings may have depths "D" of at least about 30 nanometers; and in particular embodiments may have depths of, for example, from about 30 nanometers to about 150 nanometers. Such depths "D" may be considered to extend along a vertical direction, and the openings may be considered to have a dimensions of width "W" along horizontal directions (i.e., along directions orthogonal to the direction of the depth). The openings may have a widest dimension along a horizontal direction (i.e., a widest width "W") of less than or equal to about 30 nanometers; and in some embodiments such width may be from about 20 nanometers to about 30 nanometers.

Figure 3:
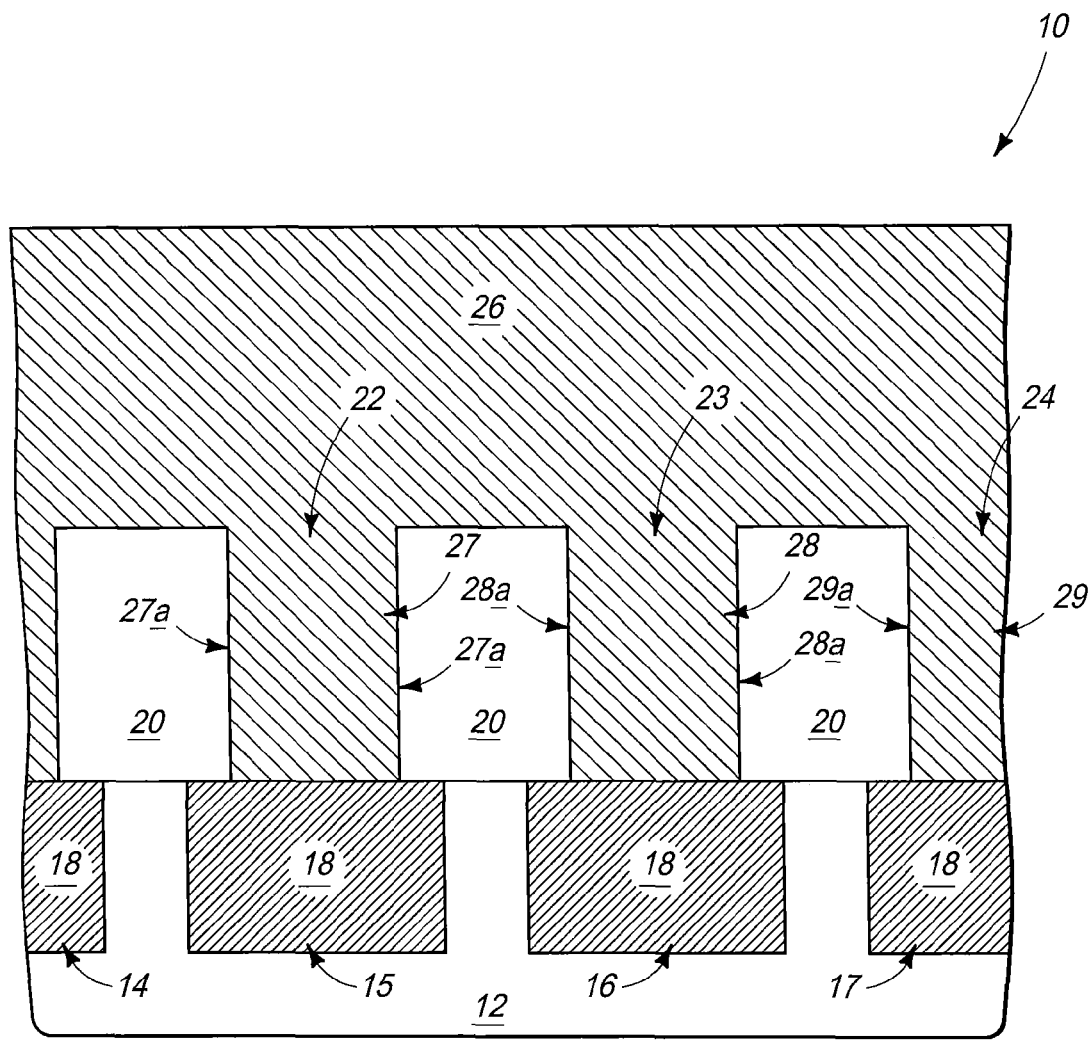
FIG. 3 is a view of the cross-section of FIG. 1 shown at a processing stage subsequent to that of FIG. 2.

Referring to FIG. 3, platinum-containing material 26 is formed over an upper surface of oxide 20, and within the openings 22-24 that extend through such oxide. The platinum-containing material may comprise, consist essentially of, or consist of platinum, and may be formed with any suitable processing, including, for example, one or more of ALD, CVD and physical vapor deposition (PVD).

The platinum-containing material within openings 22-24 may be considered to form platinum-containing plugs 27-29. Such plugs have lateral surfaces 27a, 28a and 29a, respectively, along lateral peripheries of the plugs; and such lateral surfaces are directly against oxide 20 in the shown embodiment. Also in the shown embodiment, the platinum-containing material over the oxide 20 is directly against an upper surface of the oxide.

The platinum-containing plugs 27-29 directly contact upper surfaces of conductive structures 15-17. In some embodiments, the plugs 27-29 may correspond to bottom electrodes that are ultimately incorporated into memory cells. In other embodiments, the plugs 27-29 may correspond to electrically conductive contacts that are ultimately utilized to interconnect conductive structures 15-17 with other circuitry (not shown).

Figure 4:
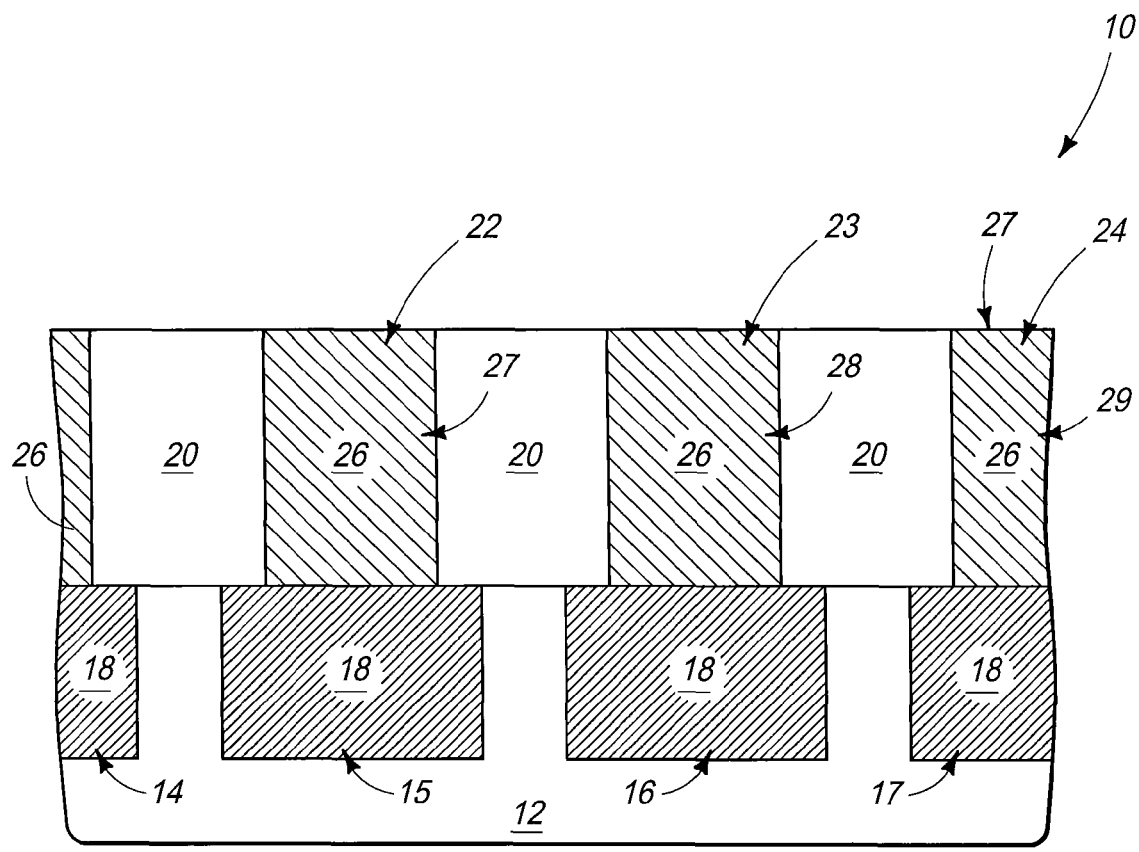
FIG. 4 is a view of the cross-section of FIG. 1 shown at a processing stage subsequent to that of FIG. 3.
Figure 5:
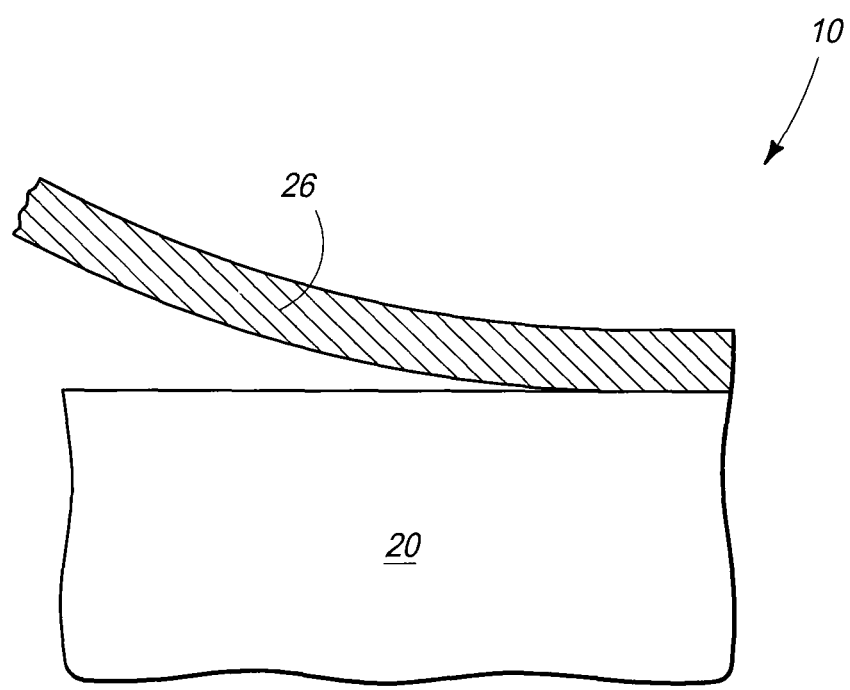
FIG. 5 is a diagrammatic cross-sectional view of a portion of a semiconductor construction showing a platinum-containing material delaminating from an underlying material during an example embodiment polishing process.

Referring to FIG. 4, construction 10 is subjected to polishing (for instance, chemical-mechanical polishing [CMP]) to remove platinum-containing material 26 from over the upper surface of oxide 20. The polishing forms the shown planarized surface 27 extending across oxide 20 and platinum-containing material 26, and electrically isolates plugs 27-29 from one another. In some embodiments, the plugs may ultimately correspond to bottom electrodes of memory cells, and in such embodiments the polishing may be considered to electrically isolate such electrodes from one another.

The polishing may utilize any suitable polishing slurry. For instance, the polishing may utilize a noble metal polishing slurry, such as, for example, a slurry referred to as FCN-120™, and available from Fujimi Corporation of Tualatin, Oreg. Noble metal polishing slurries are often provided by vendors as a first component which is to be mixed with hydrogen peroxide at the point of use. The vendors will recommend a mixing ratio of the hydrogen peroxide to the first component to form a mixture which they believe will achieve desired results. It is found that the removal of platinum from over oxide in embodiments such as that of FIG. 4 may be improved if more hydrogen peroxide is incorporated into the mixture than is recommended by vendors for the "normal" applications of the noble metal polishing slurries. For instance, vendors recommend that the noble metal polishing slurry referred to as FCN120™ be mixed in a ratio such that there are from about 10 to about 20 parts of hydrogen peroxide (with the hydrogen peroxide being a 30 percent volume: volume solution in water) combined with about 100 parts of the noble metal polishing slurry; and it is found that better results are achieved for the FIG. 4 application of removing platinum-containing material from over oxide if the noble metal polishing slurry is mixed in a ratio such that there are at least about 40 parts of the hydrogen peroxide combined with 100 parts of the noble metal polishing slurry.

The polishing may be conducted at any suitable temperature, and in some embodiments may be conducted at about room temperature (about 22° C.).

As mentioned above in the "Background" section of this disclosure, it can be difficult to satisfactorily polish platinum with conventional processes. However, in some embodiments it is advantageously recognized that platinum may be readily removed from over oxide with appropriate polishing, such as the utilization of the noble metal polishing slurry FCN120™ discussed above. The prior art generally does not attempt to remove platinum relative to oxide, but rather will have a liner (for instance, silicon nitride) between the platinum and the oxide.

In some embodiments, it is found that platinum may be satisfactorily removed from directly over oxide, and that there may be a relatively high effective selectivity for the platinum-containing material relative to the oxide during such polishing For instance, the effective selectivity for the platinum relative to silicon dioxide may be at least about 5:1.

The selectivity for the platinum-containing material relative to the oxide is referred to as an "effective selectivity" because the polishing will have both a chemical component (specifically, chemical removal brought about by etchants in the slurry), and a mechanical component (specifically, abrasive removal brought about by particulates in the slurry). Selectivity typically results from chemical preference for one material relative to another, and often is not manifested by mechanical processes. However, the noble metal polishing slurries may have an observed selectivity for platinum-containing material relative to oxide, in spite of the fact that such polishing slurries have the mechanical component of the removal process in addition to the chemical component; and such observed selectivity is what is be referred to herein as the "effective selectivity" for platinum-containing material relative to oxide.

Investigation into the polishing process has indicated that a possible mechanism for the observed selectivity for platinum removal relative to oxide removal is that the platinum-containing material delaminates from the oxide during the polishing process. Such delamination is diagrammatically illustrated in FIG. 5. Specifically, platinum-containing material 26 is shown lifting off from a surface of oxide 20 during a polishing process.

The delamination may selectively remove the platinum-containing material from over the upper surface of oxide 20, while leaving the platinum-containing material within openings 22-24 (FIGS. 3 and 4) due to the mechanical difficulty of extracting the plugs from the openings, and/or due to relatively strong interactions of the plugs with the conductive material 18 of structures 14-17. The delamination mechanism may be particularly beneficial when the thickness of the platinum-containing material over the oxide is less than or equal to about 300 Å.

The mechanisms provided herein for explaining the success of the polishing method for selectively removing platinum-containing material from over an upper surface of oxide while leaving the platinum-containing material within openings extending through the oxide are to assist the reader in understanding aspects of some embodiments of the invention. The mechanisms are not to limit any aspects of the invention claimed herein except to the extent, if any, that such mechanisms are expressly recited in the claims that follow.

Figure 6:
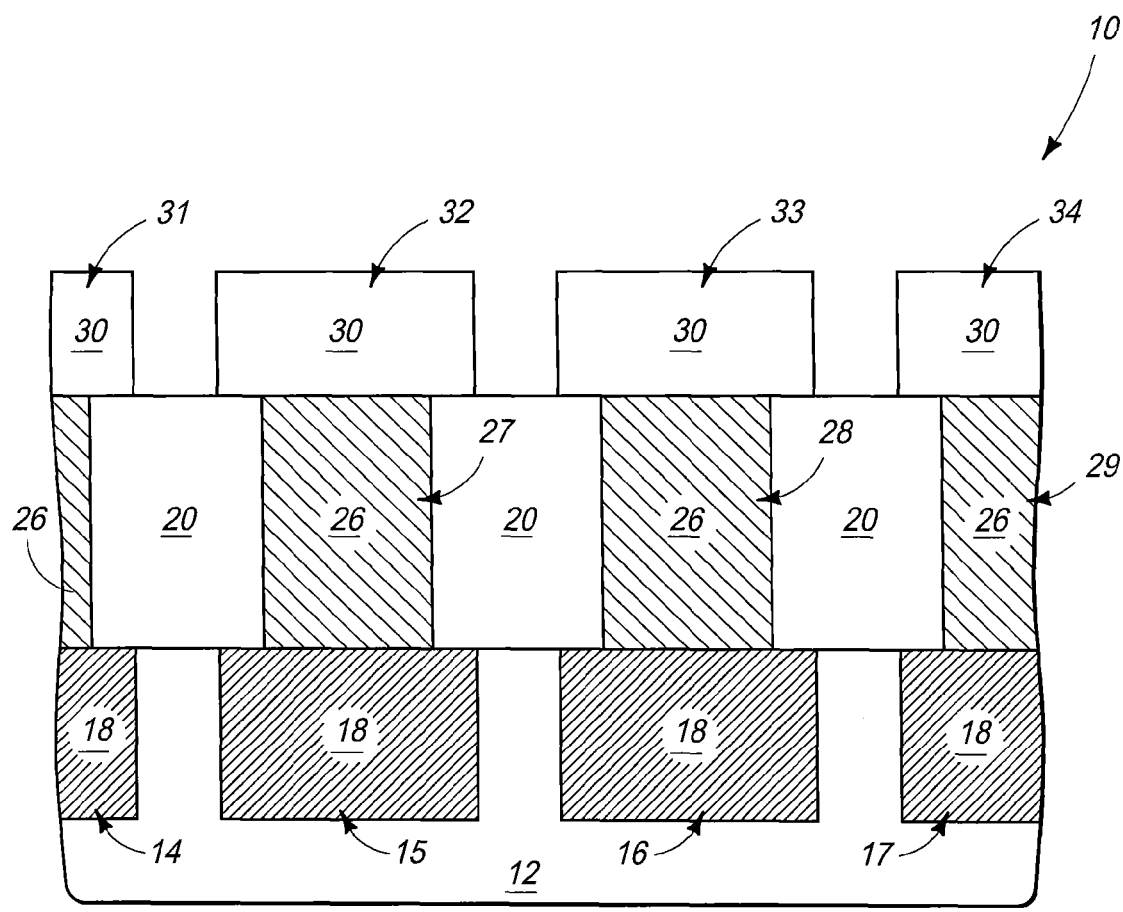
FIG. 6 is a view of the cross-section of FIG. 1 shown at a processing stage subsequent to that of FIG. 4.

Referring to FIG. 6, patterned blocks 31-34 of programmable material 30 are formed over plugs 27-29; and in the shown embodiment the programmable material is formed directly against upper surfaces of such plugs. The programmable material may be patterned with any suitable processing. For instance, the programmable material may be formed as a layer extending entirely across the planarized upper surface 27, a patterned mask (not shown) to be formed over the programmable material, a pattern may be transferred from the mask to the programmable material with one or more suitable etches, and then the mask may be removed to leave the shown construction of FIG. 6.

Although the programmable material is shown patterned into a plurality of separate blocks, in other embodiments the programmable material may remain as a layer extending entirely across planarized surface 27. Ultimately, the blocks 31-34 are incorporated into separate memory cells, and the separation of the programmable material into separate blocks forms electrical isolation between the programmable material of adjacent memory cells. If the programmable material remains extending entirely across upper surface 27, segments of the programmable material within individual memory cells may be electrically isolated from one another with other suitable processing, such as, for example, implanting dopant into intervening regions between adjacent memory cells.

The programmable material 30 may comprise any suitable composition or combination of compositions. In some embodiments, the programmable material may comprise an ion-mobility-based programmable material; such as, for example, a combination of Pr, Ca, Mn and O (for instance, $Pr_{0.7}Ca_{0.3}MnO_3$).

Figure 7:
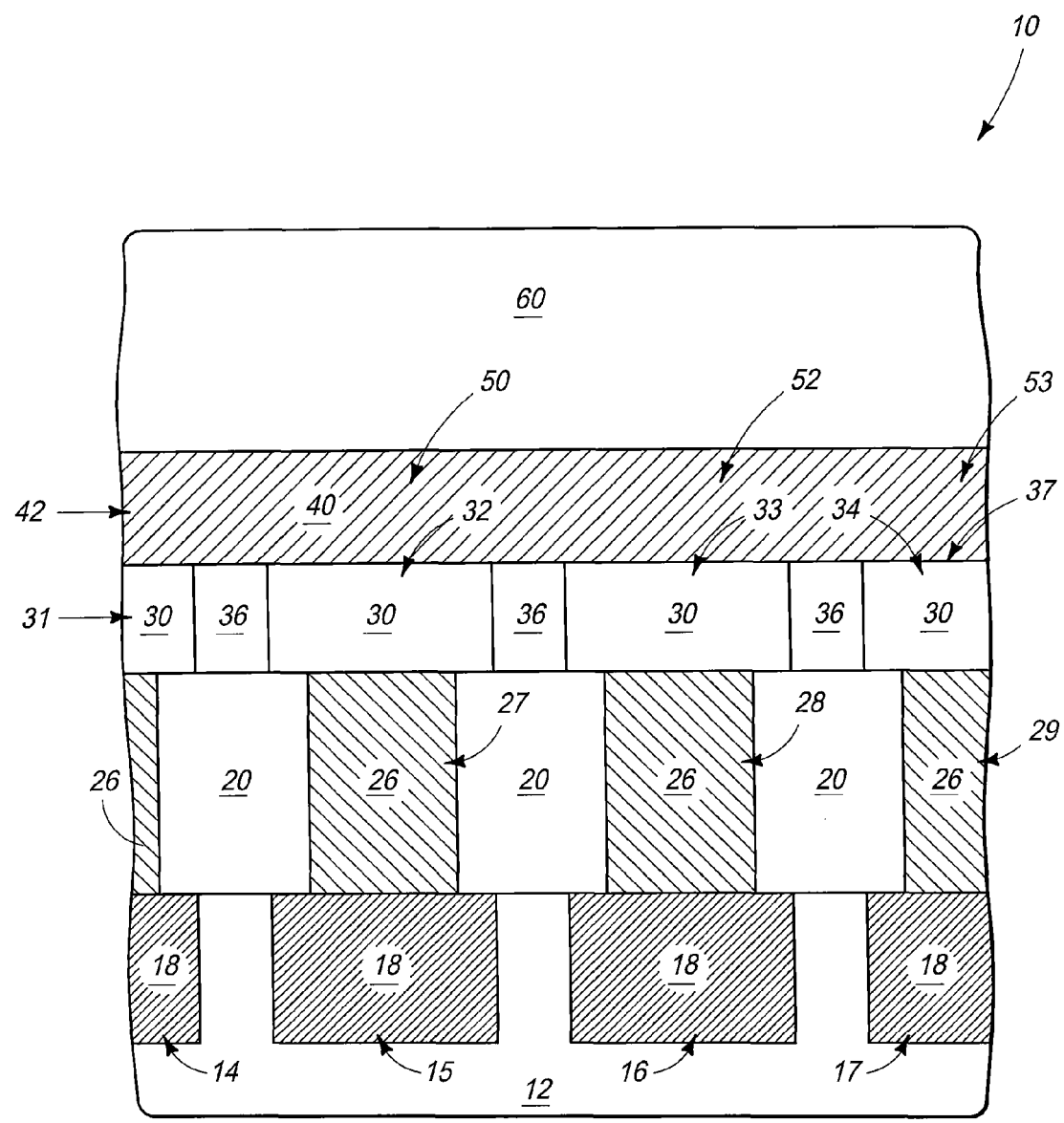
FIG. 7 is a view of the cross-section of FIG. 1 shown at a processing stage subsequent to that of FIG. 6.

Referring to FIG. 7, electrically insulative material 36 is formed in spaces between the blocks 31-34 of the programmable material. The electrically insulative may comprise any suitable composition or combination of compositions, and in some embodiments may comprise one or more of silicon oxide, silicon nitride, and any of various doped glasses. In some embodiments, insulative material 36 may comprise the same composition as oxide 20, and in other embodiments the insulative material 36 may comprise a different composition than oxide 20.

The insulative material 36 may be formed by any suitable process, including, for example, one or both of ALD and CVD. In some embodiments, material 36 may be provided to overfill the spaces between blocks 31-34, and then polishing (for instance, CMP) may be utilized to remove material 36 from over programmable material 30 and form a planarized surface 37 extending across materials 30 and 36.

An electrically conductive material 40 is formed across planarized surface 37. The electrically conductive material 40 may comprise any suitable composition or combination of compositions, and in some embodiments may comprise one or more of various metals, metal-containing substances, and conductively-doped semiconductor materials.

In the shown embodiment, the plugs 27-29 correspond to bottom electrodes of memory cells 50-53, and the conductive material 40 forms a top electrode 42 extending across the memory cells. Each of the memory cells comprises one of the blocks 31-34 of the programmable material 30.

In some embodiments, the conductive structures 14-17 may be representative of a first series of access/sense lines extending in and out of the page relative to the cross-section of FIG. 7, and the top electrode 42 may be representative of a second series of access/sense lines that extend along a same direction as the cross-section section of FIG. 7, and thus extend orthogonally relative to the first series of access/sense lines. The access/sense lines of the first and second series may correspond to, for example, bitlines and wordlines. Each of the memory cells 50-53 may be uniquely addressed by the combination of an access/sense line from the first series and an access/sense line from the second series.

An electrically insulative capping material 60 is formed over the top electrode 42. Such capping material may electrically isolate the top electrode from other circuitry (not shown) subsequently fabricated over the top electrode.

The illustrated memory cells 50-53 may be incorporated into integrated circuitry (e.g., incorporated into circuitry supported by a silicon-containing die or chip), and thus may be part of an integrated memory array.

The memory cells and memory arrays described herein may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments described herein include a method of patterning platinum-containing material. An opening may be formed to extend into an oxide. Platinum-containing material may be formed over and directly against an upper surface of the oxide, and within the opening. The platinum-containing material within the opening may form a plug having a lateral periphery that is directly against the oxide. The platinum-containing material may be subjected to polishing to remove the platinum-containing material from over the upper surface of the oxide. The polishing may delaminate the platinum-containing material from the oxide, and may remove the platinum-containing material from over the oxide with an effective selectivity for the platinum-containing material relative to the oxide of at least about 5:1.

Some embodiments described herein include methods of forming memory cells. Oxide may be formed over an electrically conductive structure, and an opening may be formed to extend through the oxide and to an upper surface of the electrically conductive structure. Platinum-containing material may be formed over and directly against an upper surface of the oxide, and within the opening. The platinum-containing material within the opening may form a bottom electrode having a lateral periphery, and the lateral periphery of the bottom electrode may be directly against the oxide. The platinum-containing material may be subjected to polishing to remove the platinum-containing material from over the upper surface of the oxide. The polishing may delaminate the platinum-containing material from the oxide, and may remove the platinum-containing material from over the oxide with an effective selectivity for the platinum-containing material relative to the oxide of at least about 5:1. Programmable material may be formed over the bottom electrode, and a top electrode may be formed over the programmable material.

Some embodiments described herein include integrated circuitry. The integrated circuitry may comprise an electrically conductive structure, an oxide having an opening extending therethrough to an upper surface of the electrically conductive structure, and platinum-containing material within the opening. The platinum-containing material may be directly against the upper surface of the electrically conductive structure, and may be directly against the oxide.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. Integrated circuitry, comprising:
    an electrically conductive structure;
    an oxide having an opening extending therethrough to an upper surface of the electrically conductive structure;
    platinum-containing material within the opening; the platinum-containing material being directly against the upper surface of the conductive structure and being directly against the oxide;
    wherein the platinum-containing material within the opening is a bottom electrode of a memory cell; and
    wherein the memory cell further comprises:
        programmable material over and directly against the bottom electrode; and
        a top electrode over the programmable material.

2. The integrated circuitry of claim 1 wherein the programmable material comprises Pr, Ca, Mn and O.

3. The integrated circuitry of claim 1 wherein the oxide comprises silicon dioxide.

4. The integrated circuitry of claim 1 wherein the oxide consists essentially of silicon dioxide.

5. The integrated circuitry of claim 1 wherein the oxide consists of silicon dioxide.

6. The integrated circuitry of claim 1 wherein the platinum-containing material comprises platinum.

7. The integrated circuitry of claim 1 wherein the platinum-containing material consists essentially of platinum.

8. The integrated circuitry of claim 1 wherein the platinum-containing material consists of platinum.

9. Integrated circuitry, comprising:
an electrically conductive access/sense line;
an oxide having an opening extending therethrough to an upper surface of the access/sense line; the oxide consisting of silicon dioxide; and
a platinum-containing plug within the opening; the platinum-containing plug being directly against the upper surface of the access/sense line and being directly against the oxide; the platinum-containing plug being an electrode of a memory cell; the memory cell further comprising programmable material directly against the electrode; the programmable material comprising Pr, Ca, Mn and O.

\* \* \* \* \*